United States Patent [19]

Masuda

[11] Patent Number: 5,755,910
[45] Date of Patent: May 26, 1998

[54] METHOD OF TRANSFERRING A COLOR PROOF

[75] Inventor: Tetsuya Masuda, Yokohama, Japan

[73] Assignee: Mitsubishi Chemical Corporation, Tokyo, Japan

[21] Appl. No.: 627,047

[22] Filed: Apr. 3, 1996

[30] Foreign Application Priority Data

Apr. 6, 1995 [JP] Japan .................................. 7-106964
Dec. 12, 1995 [JP] Japan .................................. 7-322815

[51] Int. Cl.$^6$ .......................... B32B 31/20; G03B 27/02
[52] U.S. Cl. .......................... 156/235; 156/312; 355/132; 430/293; 430/358
[58] Field of Search .......................... 156/230, 235, 156/359, 312; 355/79, 80, 88, 107, 108, 132; 430/257, 292, 293, 358

[56] References Cited

U.S. PATENT DOCUMENTS

| 5,001,034 | 3/1991 | Omote et al. ........................ 430/257 |
| 5,068,689 | 11/1991 | Sasa et al. . | |
| 5,168,301 | 12/1992 | Akisada et al. ........................ 355/77 X |
| 5,227,826 | 7/1993 | Sandner ........................ 354/301 |
| 5,236,542 | 8/1993 | Bailey et al. . | |

FOREIGN PATENT DOCUMENTS

| 38 00 768 | 7/1989 | Germany . |
| 39 36 123 | 10/1990 | Germany . |
| 39 42 816 | 6/1991 | Germany . |
| 2 213 950 | 8/1989 | United Kingdom . |

*Primary Examiner*—Curtis Mayes
*Attorney, Agent, or Firm*—Oblon, Spivak, McClelland, Maier & Neustadt, P.C.

[57] ABSTRACT

A method of transferring a color proof comprises stacking an image receiving sheet and a color sheet having colorant images formed on a support, applying pressing to the stacked sheets by a heating roller to transfer the colorant images to the image receiving sheet, and conducting the transfer repeatingly for different color sheets, the transfer for each of the color sheets being conducted at two stages with different rotational speeds of the transfer drum and the transfer being conducted at the second stage under a lower speed condition than in the first stage.

20 Claims, 4 Drawing Sheets

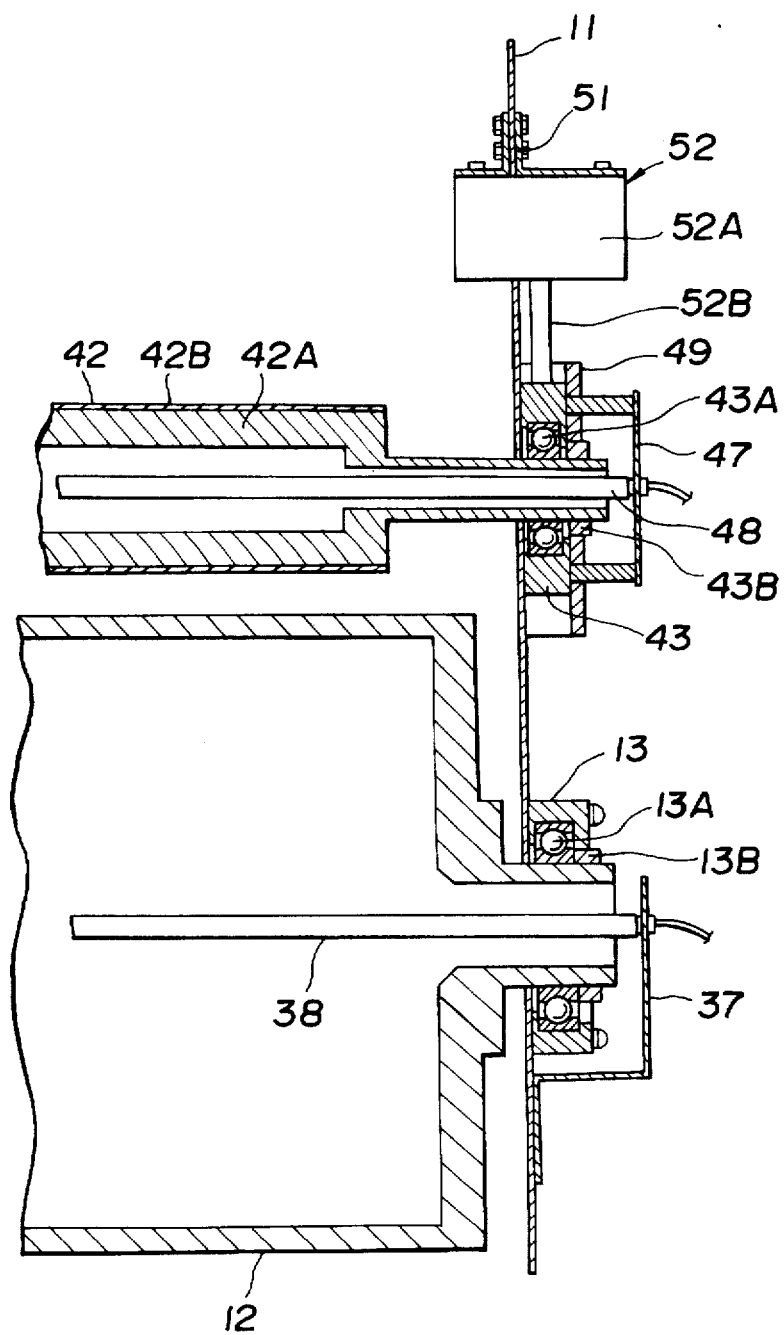

METHOD OF TRANSFERRING A COLOR PROOF

BACKGROUND OF THE INVENTION

The present invention relates to a method of transferring a color proof and, more in particular, it relates to a method of transferring a color proof improved such that registration variance of multicolor images can be prevented.

Heretofore, in the field of multicolor printing, color proofing has generally been conducted by off-press proofing as a preceding step to printing. That is, a color proof is transferred and formed by applying a hot pressing to an image receiving sheet and a color sheet having colorant images formed thereon while stacking the sheets to each other, thereby transferring the colorant images to the image receiving sheet, and then applying the treatment described above repeatingly for different color sheets. A color sheet for each of colors: yellow (Y), magenta (M), cyan (CN) and black (BK) is obtained by stacking a separation screen film for each of color prints on the color sheet as an image forming material and then applying exposure and development.

Transfer of the color proof is conducted by an image transferring device adapted to apply pressing by a heat roller to the image receiving sheet and the color sheet having colorant images formed thereon, while stacking the image receiving sheet and the color sheet to each other on a transfer drum. As the transfer device, there can be mentioned various types of image transferring devices as described, for example, in Japanese Patent Application Laid-Open (KOKAI) No. 3-114044, Japanese Patent Application Laid-Open (KOKAI) No. 3-120552 and Japanese Patent Application Laid-Open (KOKAI) No. 3-135049.

By the way, when a color proof is transferred in accordance with the known method, the registration variance is caused in multicolor images to result in a difficulty of making a color proof at high quality.

As a result of various studies of the present inventors on an existent method of transferring a color proof, it has been found that although it is difficult to prevent the registration variance of multicolor images by a method of conducting transfer for each of color sheets at one stage even if heating and/or pressing conditions for a heat roller are changed variously, by conducting transfer in each of the color sheets at two stages under specific conditions, the registration variance of multicolor images can be prevented easily. The present invention has been attained on the basis of the finding.

SUMMARY OF THE INVENTION

An object of the present invention is to provide a method of transferring a color proof improved such that the registration variance of multicolor images can be prevented.

To accomplish the aim, in an aspect of the present invention, there is provided a method of transferring a color proof comprising applying pressing by a heat roller to an image receiving sheet and a color sheet having colorant images formed on a support while stacking the sheets to each other on a transfer drum, thereby transferring the colorant images to the image receiving sheet, and applying the transfer repeatingly for different color sheets, wherein the transfer for each of the color sheets is conducted at two stages under different rotational speeds of the transfer drum and the transfer is conducted at a lower speed condition at the second stage than that at the first stage.

BRIEF DESCRIPTION OF THE DRAWINGS

FIG. 4 is a cross sectional view taken along line IV—IV in FIG. 2.

DETAILED DESCRIPTION OF THE INVENTION

Figure 1:
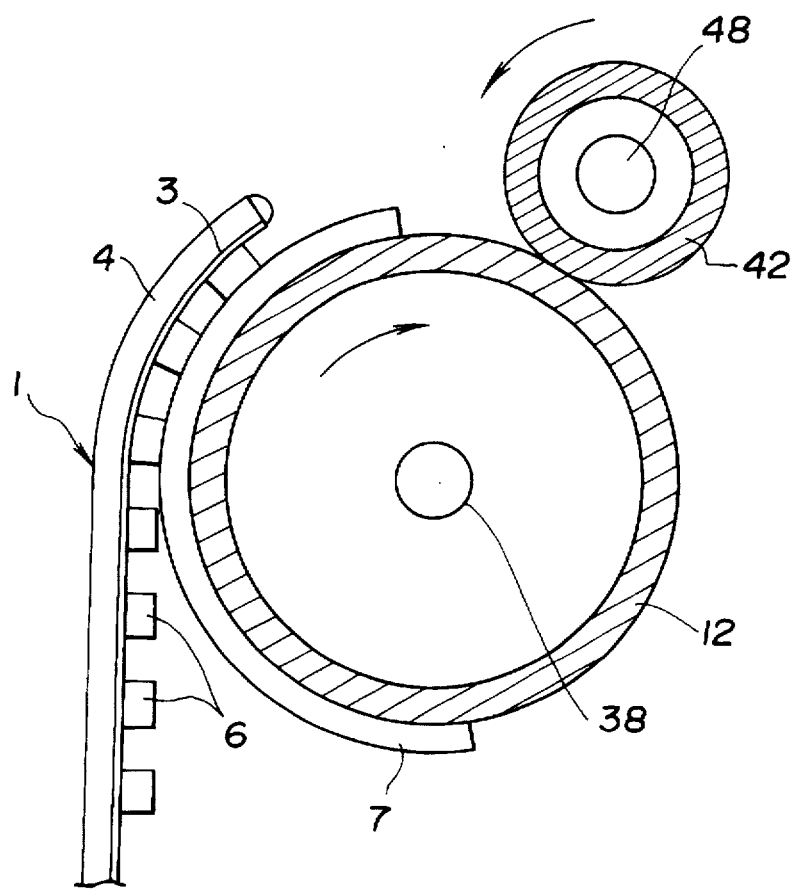
FIG. 1 is a schematic front view of a portion for one example of an image transferring device applicable to a method of transferring a color proof of the present invention.

In the present invention, a color sheet as an image forming material comprises a light sensitive colored layer disposed on a support. As the support, there can be exemplified a film comprising a transparent synthetic resin, for example, polyolefin such as polypropylene, polyester such as polyethylene terephthalate, polybutylene terephthalate and polyethylene naphthalate, polyamide such as nylon 6 and nylon 6/6, polyester amide, polycarbonate and polyether ketone.

The film described above preferably has a maximum heat expansion coefficient ($\alpha$tmax) of not more than $2.5 \times 10^{-5}$/°C. as described in Japanese Patent Application Laid-Open (KOKAI) No. 7-43898 or has an angle of orientation in a range from $-20°$ to $+20°$ as described in Japanese Patent Application Laid-Open (KOKAI) No. 5-273743, in order to decrease color deviation due to the difference of the heat expansion coefficient between longitudinal and transverse directions upon transfer. If it is intended to obtain a more fine images, it is preferred to select a support having a smaller maximum heat expansion coefficient and a smaller angle of orientation.

The maximum heat expansion coefficient means a maximum heat expansion coefficient among heat expansion coefficient ($\alpha$t) at all positions and in all direction on the surface of the support. In a usual biaxially stretched film, the maximum heat expansion coefficient is present in a main orienting direction or a direction in perpendicular thereto in a surface of the film.

The stretched film described above is obtained, for example, by conducting sequential biaxial stretching or simultaneous biaxial stretching at an identical stretching ratio both in the machine direction and the transverse direction under the same temperature condition and, subsequently, applying a heat treatment. In this case, it is preferred to make the stretching ratio identical between the machine direction and the transverse direction. Further, the subsequent heat treatment is preferably applied in a relaxed state.

In the present invention, for improving the handlability, it is preferred to add inorganic particles such as silica, alumina, kaolin or talc to the support film. There is no particular restriction on the thickness of the support and, in view of mechanical strength and heat conduction upon transfer, it is preferably from 10 to 300 μm, more preferably from 50 to 100 μm.

For improving the transferability of images formed on the support, a releasing layer is preferably disposed on the support. For the releasing layer, there may be used, for example, a vinylacetate-based copolymer such as ethylene vinylacetate copolymer, ethylene-propylene vinyl acetate copolymer or a modified product thereof. With a view point of the transferability, an ethylene-vinyl acetate copolymer having a softening point of 50° to 120° C. is particularly preferred.

As a method of forming the releasing layer with the ethylene-vinyl acetate copolymer, there can be mentioned, for example, a coating and drying method, dry lamination method, hot melt lamination method or coextrusion method as described in Japanese Patent Application Laid-Open (KOKAI) No. 3-181947. In addition, for the component of the releasing layer, it is also possible to use, for example, alcohol soluble polyamide, alcohol soluble nylon, a blend of a partially esterified resin of a copolymer of styrene and maleic acid anhydride with methoxy-methylated nylon, polymer of acrylic acid and derivative thereof, polyvinyl chloride, polyvinyl butyrate or acetic cellulose as described in Japanese Patent Application Laid-Open (KOKAI) No. 51-5101, Japanese Patent Application Laid-Open (KOKAI) No. 59-97140 and Japanese Patent Application Laid-Open (KOKAI) No. 63-2040. The thickness of the releasing layer is preferably from 5 to 200 µm, more preferably from 50 to 100 µm.

The light sensitive colored layer disposed on the support may comprise a single layer but it is not restricted only thereto. The light sensitive colored layer may be a 2-layered structure of a colored layer comprising at least a colorant and a binder, and a light sensitive layer comprising at least a light sensitive composition and a binder. In the case of using the 2-layered structure, any one of the layers may be present on the releasing layer or on the transparent support. In the followings, the explanation will be made mainly to a light sensitive colored layer comprising a single layer. Accordingly, the light sensitive layer means a light sensitive colored layer unless otherwise specified.

For the light sensitive layer, a photopolymerizable composition (negative-type light sensitive layer), quinone diazide compound (positive-type light sensitive layer), diazo compound-azide compound (negative-type light sensitive layer) can be used.

The photopolymerizable composition contains at least one monomeric compound such as a polyfunctional vinyl monomer or vinylidene compound capable of forming a photopolymerizate by addition polymerization and a photopolymerization initiator activated by active rays, to which a heat polymerization initiator is added, if necessary.

As the vinyl monomer or vinylidene compound usable in the photopolymerizable composition, an unsaturated ester of polyol, particularly, an acrylate ester or methacrylate ester is particularly preferred. As specific examples, there can be exemplified, for example, ethylene glycol diacrylate, glycerine triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentadiol dimethacrylate and bisacrylate or bismethacrylate of polyethylene glycol having a molecular weight ranging from 200 to 400. On the other hand, as the photopolymerization initiator and the heat polymerization inhibitor, known compounds can be used with no particular restriction.

As the quinone diazide compound, there can be exemplified, for example, esterification compounds of a polycondensation resin of phenols and aldehyde or ketone and o-naphthoquinone diazide sulfonic acid.

As the phenols, there can be mentioned, for example, monohydric phenols such as phenol, o-cresol, m-cresol, p-cresol, 3,5-xylenol, carvacrol and thymol, dihydric phenols such as cathecol, resorcine and hydroquinone, and trihydric phenols such as pyrogallol and fluoroglucine.

As the aldehyde, there can be exemplified, for example, formaldehyde, benzaldehyde, acetoaldehyde, crotonaldehyde and furfural. Among the aldehydes, formaldehyde and benzaldehyde are preferred. As the ketone, acetone and methyl ethyl ketone can be exemplified.

As specific examples of the polycondensation resin, there can be exemplified, for example, phenol-formaldehyde resin, m-cresol-formaldehyde resin, m-, p-mixed cresol-formaldehyde resin, resolcine-benzaldehyde resin and pyrogallol-acetone resin.

The condensation ratio of o-naphthoquinone diamide sulfonic acid to OH group on the phenols (reaction ratio per one OH group) is preferably from 15 to 80%, more preferably from 20 to 45%. The weight-average molecular weight of the polymeric compound containing o-quinone diazide is preferably not less than 1000, more preferably not less than 1500 from a view point of coatability.

As the quinonediazide compound, those compounds as described in Japanese Patent Application Laid-Open (KOKAI) No. 58-43451 can also be used in addition to the above. Further, condensation compound, for example, of 2,3,4-trihydroxybenzopnenone, 2,3,4,4'-tetrahydroxybenzophenone, 2,3,4,2'4'-pentahydroxybenzophenone or 2,3,4,3',4',5'-hexahydrobenzophenone with o-quinonediazide sulfonic acid can also be used.

Among the quinonediazide compounds described above, an o-quinonediazide ester compound obtained by reacting 1,2-naphtoquinone diazide sulfonyl chloride with a pyrogallolacetone condensation resin or novolac resin, or 2,3,4-trihydroxybenzophenone is most preferred. For the quinonediazide compound, each of the compounds may be used alone or two or more of them may be used in combination. A preferred amount of the quinone diazide compound is from 10 to 40 parts by weight based on 100 parts by weight of the binder in the light sensitive layer.

The diazo compound is typically represented by a condensation product of p-diazodiphenylamine and formaldehyde, and diazo compounds which are water insoluble and soluble to usual organic solvent as described, for example, in Japanese Patent Publication (KOKOKU) No. 47-1167 and Japanese Patent Publication (KOKOKU) No. 57-43890 are preferably used. On the other hand, as the azide compound, an aromatic diazide compound in which an azide group is connected with an aromatic ring directly or by means of a carbonyl or sulfonyl group is used preferably. Specifically, there can be used, for example, polyazide styrene, polyvinyl-p-acid benzoate, polyvinyl-p-azide benzal (U.S. Pat. No. 3,096,311), a reaction product of azide aryl sulfonyl chloride and unsaturated hydrocarbon polymer (Japanese Patent Publication (KOKOKU) No. 54-9613), a polymer having sulfonyl azide or carbonyl azide (Japanese Patent Publication (KOKOKU) No. 43-21017, Japanese Patent Publication (KOKOKU) No. 44-22954 and Japanese Patent Publication (KOKOKU) No. 45-24915).

In addition, as other negative-type light sensitive composition, a compound containing succinic acid derivative can be mentioned, for example, polyesters and polyamides containing —C=C=CO— group (U.S. Pat. No. 3,453,237), succinic acid esters of hydroxy group-containing polymers such as polyvinyl alcohol or cellulose (U.S. Pat. No. 2,732,301).

As the binder resin used for the light sensitive layer, there can be typically exemplified, for example, novolac resin, acrylic resin, vinyl acetate resin, polyurethane resin, epoxy resin and the like. For example, as the novolac resin, there can be exemplified a phenol-cresol-formaldehyde copoly-condensation resin (Japanese Patent Application Laid-Open (KOKAI) No. 55-57841), a copolycondensation resin of p-substituted phenol, phenol or cresol with formaldehyde (Japanese Patent Application Laid-Open (KOKAI) No. 55-127553). As the vinyl acetate resin, a vinyl acetate-vinyl versatate copolymer (Japanese Patent Application Laid-Open (KOKAI) No. 3-48248 and Japanese Patent Application Laid-Open (KOKAI) No. 3-181947) can be used preferably.

As the colorant contained in the light sensitive layer, a pigment or a dye is used. For example, a dye pigment for yellow, magenta, cyan or black, as well as a metal powder, white pigment or fluorescent pigment can also be used. The followings show such examples among many pigments and dyes in the relevant field of the art (C.I. means color index).

Victoria pure blue (C. I.: 42595)

Auramine (C. I.: 41000)

Carotene brilliant flavine (C. I.: Basic 13)

Rhodamine 6GCP (C. I.: 45160)

Rhodamine B (C. I.: 45170)

Safranine OK 70:100 (C. I.: 50240)

Erioglaucine X (C. I.: 42080)

Fast Black HB (C. I.: 26150)

No. 1201 Lionol yellow (C. I.: 21090)

Lionol yellow GRO (C. I.: 21090)

Symuler fast yellow 8GF (C. I.: 21105)

Benzidine yellow 4T-564E (C. I.: 21095)

Symuler fast red 4015 (C. I.: 12355)

Lionol Red 7B4401 (C. I.: 15830)

Fastogen blue TGR-L (C. I.: 74160)

Lionol blue—SM (C. I.: 26150)

Mitsubishi carbon black MA-100

Mitsubishi carbon black #30, #40, #50

Cyanine blue—4920 (produced by Dainichi Seika Co., Ltd.)

Seika fast carmine 1483 (produced by Dainichi Seika Co., Ltd.)

Seika fast yellow-H-7005.2400 (produced by Dainichi Seika Co., Ltd.)

The blending amount of the colorant in the light sensitive layer is determined considering the aimed optical density and the removability (solubility) of the light sensitive layer to a liquid developer. For example, a generally preferred blending amount for a dye is from 5 to 75% by weight and a generally preferred blending amount for a pigment is from 5 to 90% by weight. More preferably, the amount is from 5 to 50% by weight for both of dye and pigment.

Further, the thickness of the light sensitive layer is selected in accordance with the aimed optical density, the kind and the content of the colorant (dye, pigment, carbon black) used in the light sensitive layer. As the thickness is reduced, the resolution is higher and image quality is improved. Accordingly, the layer thickness is preferably selected within a range from 0.1 to 5 µm.

In the light sensitive layer, a plasticizer, a coatability improver or the like can be added, if necessary. As the plasticizer, there can be mentioned, for example, phthalic acid esters, triphenyl phosphates, or maleic acid esters. As the coatability improver, there can be exemplified, for example, nonionic surface active agents such as ethyl cellulose and polyalkylene ether, and fluoro surface active agents.

The light sensitive layer is usually formed by dissolving a light sensitive composition, a colorant and the like in an appropriate solvent to prepare a coating solution, and coating the solution on a releasing layer.

As the solvent, there can be exemplified, for example, methyl lactate, methyl ethyl ketone, cyclohexanone, ethylene dichloride, dichloromethane, acetone, methyl isobutyl ketone, ethyl acetate, ethylene glycol monomethyl ether, ethylene glycol monomethyl ether acetate, ethylene glycol monoethyl ether, ethylene glycol monoethyl ether acetate, N,N-dimethylformaldehyde, dimethylsulfoxide, N,N-dimethylacetoamide, acetyl acetone, dioxane, tetrahydrofuran, γ-butyrolactone, propylene glycol monomethyl ether, propylene glycol monoethyl acetate, propylene glycol monoethyl ether acetate, diethylene glycol dimethyl ether and diethylene glycol diethyl ether. Particularly preferred solvent is methyl lactate, methyl ethyl ketone or a mixture thereof comprising the above-mentioned solvent as a main component together with other solvent.

As the coating method, there can be used, for example, roll coating method, reverse roll coating method, dip coating method, air knife coating method, gravure coating method, gravure offset coating method, hopper coating method, blade coating method, rod coating method, wire doctor coating method, spray coating method, curtain coating method or extrusion coating method.

Further, if the light sensitive colored layer is present being divided into a color layer and a light sensitive layer, or an overcoat layer is coated on the light sensitive colored layer, there can be used, for example, a sequential multilayer coating method of applying coating/drying and then winding on every layer, and a method of arranging a plurality of coaters or driers on one line and providing a plurality of layers by transportation of the support for once (Japanese Patent Application Laid-Open (KOKAI) No. 63-69574).

The drying after the coating is conducted usually by blowing hot air to a coating surface. The heating temperature is preferably from 30° to 200° C., particularly preferably from 40° to 140° C. Generally, a method of drying a colored light sensitive layer while maintaining the temperature of the hot air constant, but a method of drying by elevating the temperature of the hot air stepwise can also be adopted. Further, the heated air is supplied to the coated surface at a rate preferably from 0.1 to 30 m/sec, particularly preferably at a rate of 0.5 to 20 m/sec.

Images in the light sensitive colored layer are formed as described below. At first, a color separation screen film and a colored image forming material corresponding to each of colors are adhered and an imagewise exposure is carried out by irradiation of light such as UV-rays. As a light source, there may be used, for example, a mercury lamp, super high pressure mercury lamp, metal halide lamp, tungsten lamp, xenon lamp or fluorescents lamp. In the same manner, the imagewise exposure is applied for other three colors. In this case, the exposure from the side of the support preferably provides higher image reproducibility. Then, each of the exposed materials is applied with liquid development by using a liquid developer, and then washed with water and dried to form images. As another developing method, it is possible to adopt a method of conducting peeling development by peeling a cover sheet as described, for example, in Japanese Patent Application Laid-Open (KOKAI) No. 2-269349.

In the present invention, a color proof is transferred by using a color sheet on which colorant images are formed as described above. That is, the colorant images are transferred to a image receiving sheet on a transfer drum by applying pressing by means of a heating roller to the image receiving sheet and the color sheets having colorant images formed thereof, stacking each other, and then applying the treatment for different color sheets.

As the image receiving sheet, there can be used paper such as wood free paper, thickly coated paper and coated paper, plastic film such as polyester film and acetate film, a plastic film coated with an intermediate layer or image receiving layer, a metal foil such as aluminum foil and cooper foil, and composite material thereof.

Figure 2:
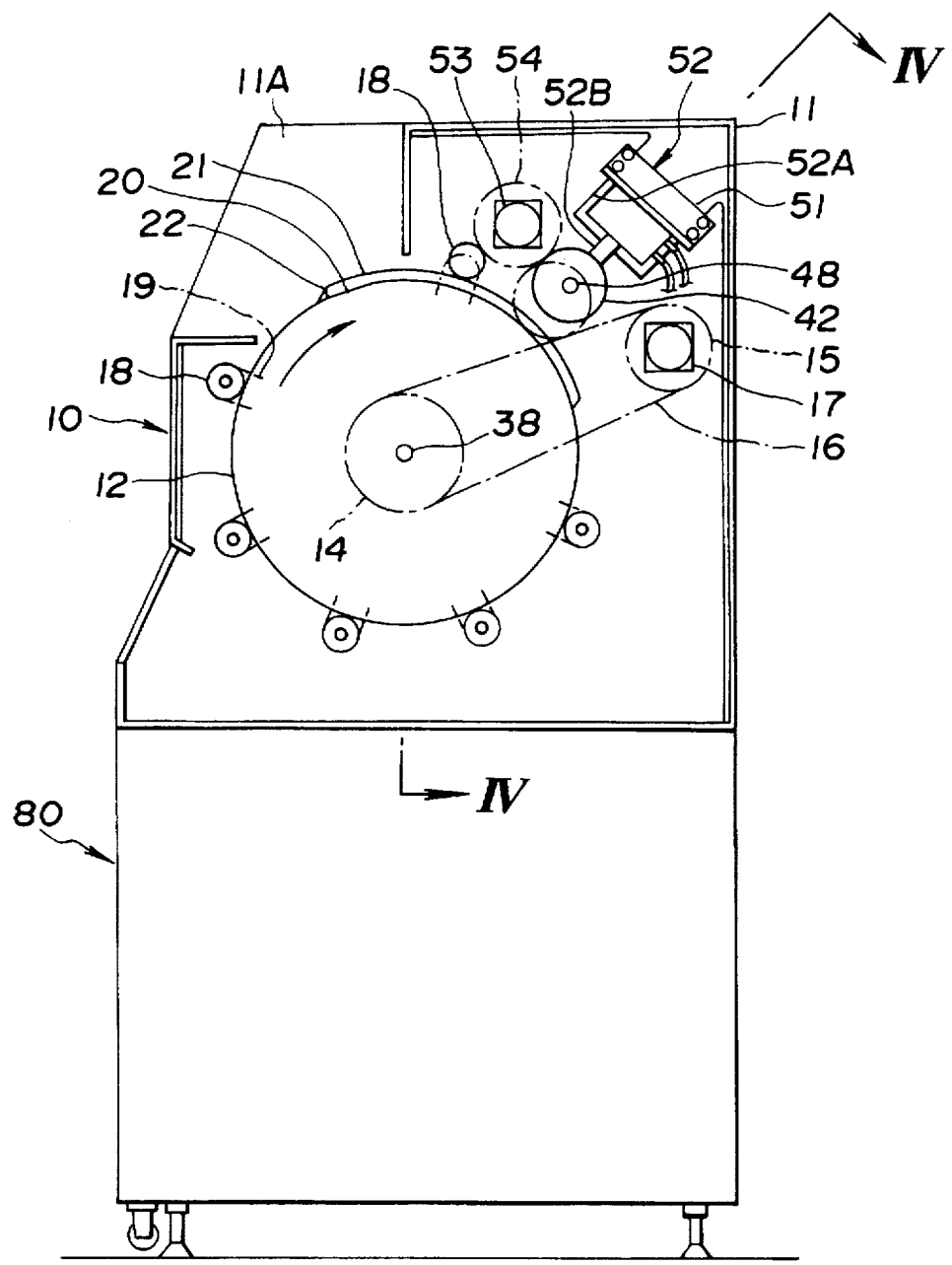
FIG. 2 is a front view illustrating the inside of the image transferring device shown in FIG. 1.
Figure 3:
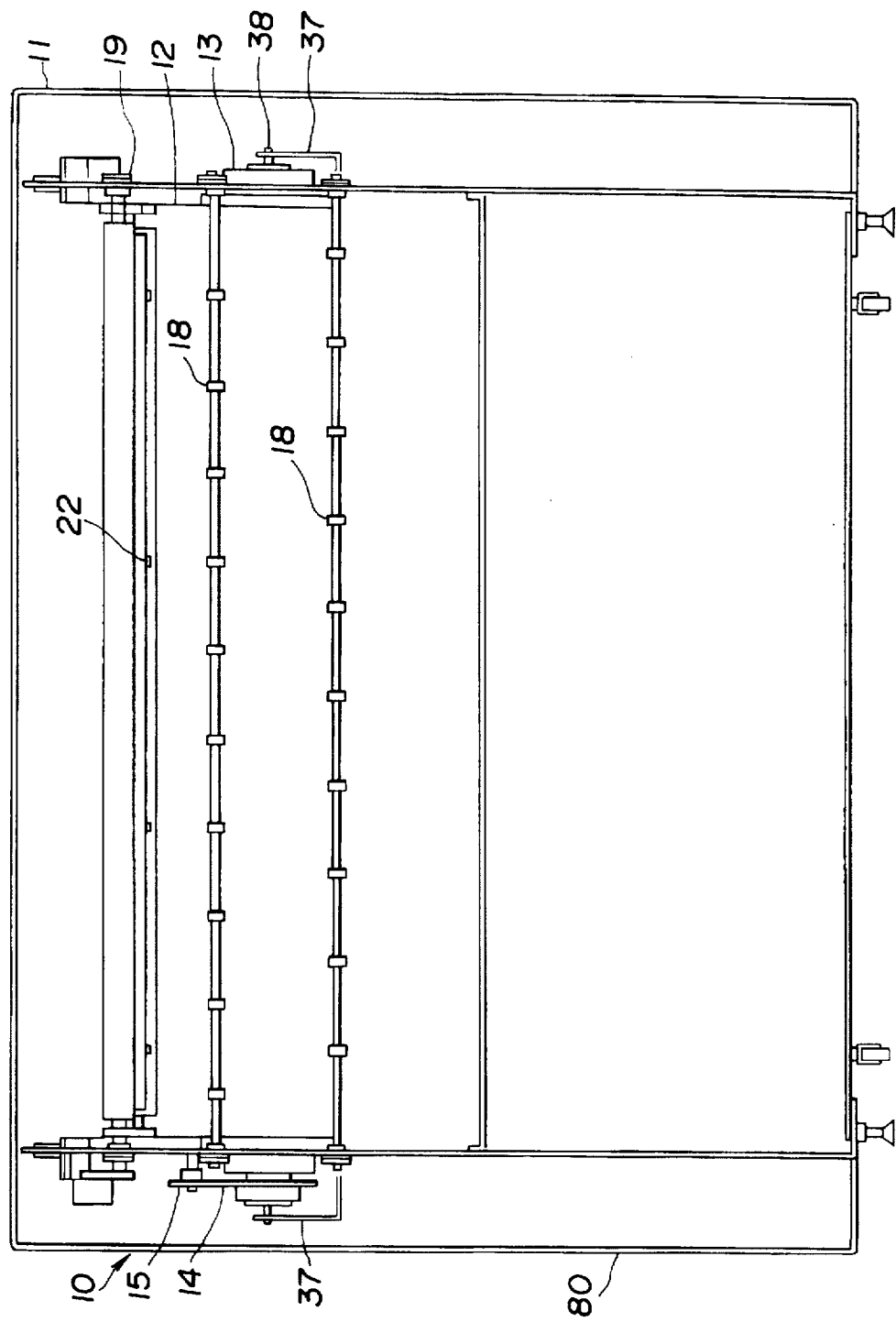
FIG. 3 is a left side view illustrating the inside of the image transferring device shown in FIG. 1.

The method of transferring the color proof in the present invention can be conducted by utilizing various kinds of image transferring devices known in the prior art as described above. That is, in the present invention, an image transferring device of any structure can be utilized so long as it is constituted to apply pressing by means of a heating roller to an image receiving sheet and a color sheet having colorant image formed thereon stacking the sheets to each other on a transfer drum. For example, a device shown in FIGS. 1 to 4 which is disclosed in Example 1 of Japanese Patent Application Laid-Open (KOKAI) No. 3-120552 can be used properly.

The ordinary transferring method of the color proof by using the image transfer device described above schematically shown in FIG. 1 is set forth below. An image receiving sheet 7 is attached on a transfer drum 12 previously heated to a predetermined temperature, and a color sheet 1 is stacked on the image receiving sheet 7. The transfer drum 12 is rotated in the direction of an arrow, and pressing is applied by urging a heat (press) roller 42 previously heated to a predetermined temperature to the color sheet 1. Then, a support (film) 4 of the color sheet 1 is peeled at the downstream of the heat roller 42. Images 6 are transferred by the operation to the image receiving sheet 7. When the transfer drum 12 rotates by one turn and the image receiving sheet 7 returns to the original position, the rotation of the transfer drum 12 is stopped, and an image sheet for the next color is attached to the transferred paper to conduct transfer for the next color. Transfer images exactly reproducing an original are formed on the image receiving sheet 7 by conducting the transfer by the operation in the order of yellow (Y), magenta (M), cyan (CN) and black (BK). In the figure, a heat softening layer represented by a numeral 3 is disposed optionally.

A transfer device 10 is placed on a casing 80 incorporating an air compressor not illustrated, and both of the transfer device and casing are integrated. Then, a transfer drum 12 is disposed by way of a bearing 13 incorporating a ball bearing 13A and a bearing stopper 13B attached to a main body frame 11, and the transfer drum 12 can be driven as shown by an arrow by a drum driving motor 17 by way of chain wheels 14, 15 and a chain 16. Further, a heater 38 for heating is provided being held by an attaching metal 37 to a shaft core. Accordingly, it is constituted such that the drum 12 can easily be controlled entirely to a uniform temperature (50° to 100° C.) by the heater 38 for heating.

A plurality of retainer rollers 18 are disposed each at a predetermined interval on the outer circumference of the transfer drum 12, and are pressed so as to be in contact with the transfer drum 12 by a roller pressing spring 19, whereby the bearing portion of the retainer roller 18 is disposed slidably in the radial direction of the transfer drum 12 of the main body frame 11. The pressing spring 19 is resiliently biased such that it moves the bearing portion in the pressing direction. Further, the retainer roller 18 is made free from the disconnect contact with the transfer drum 12 against the pressing spring 19 by a pull-up spacer 21 disposed on the outer circumference on both sides of the transfer drum 12.

Further, a heat roller 42 capable of pressing the transfer drum 12 at a uniform temperature and, further, capable of heating the same to a temperature required for transfer is disposed as a roller comprising a core roller 42A covered with an elastic member 42B. The shaft portions on both ends are received by a bearing 43 incorporating a ball bearing 43A and a bearing stopper 43B.

The core roller 42A has a function of imparting the heat roller 42 with strength and it is usually made of metal such as iron and an alloy thereof. The material for the elastic member 42B, preferably, has a spring hardness JIS A (JIS K6301) in a range from 10 to 100. Specifically, there can be exemplified, for example, natural rubber, silicone rubber, neoprene rubber, butyl rubber, SBR rubber, EPDM, hyperon, thiocol, Viton and polyester urethane. The elastic member 42B can be coated to the core roller 42A by usual means such as coating or lamination.

The bearing 43 is attached so as to be slidable in a slide guide 49 attached to the main body frame 11. The sliding direction is in the radial direction of the transfer drum 12. The bearing 43 is directly connected with a movable portion 52B of an air pressurizing cylinder 52 connected to an air compressor in the casing 80, while a fixed portion 52A of the air pressurizing cylinder 52 is fixed to the main body frame 11 by means of a cylinder attaching metal 51. Further, a heater 48 is fixedly disposed to the shaft core portion of the heat roller 42, and fixed on the attaching metal 47 disposed to the sliding bearing 43.

Positional alignment between the image receiving sheet and the color proof (both not illustrated) is conducted as below. That is, a portion on the surface of the transfer drum 12 corresponding to the front end of the pull-up spacer 21 is made flat as a registering portion 20, and a pin bar 22 is attached to the registering portion 20. The image receiving sheet and the color proof can be positionally aligned acurately by way of the transfer drum 12 by engaging a through hole of a small diameter disposed at the side edge of the color proof with the pin bar 22.

The image receiving sheet and the color proof are in press contact with each other between the heat roller 42 and the transfer drum 12 under the action of the air cylinder 52 and, subsequently, the color proof is peeled off the image receiving sheet and the images of the color proof are transferred to the image receiving sheet. An outer cover 11A is disposed to the outside of the main body frame 11 for the transfer section 10 and the casing 80, on which an operation board or the like is disposed so as to facilitate and simplify the operation and ensure safety.

Then, when the positioning portion 20 returns to the original position, transfer for the next color is conducted successively. Thus, only the transfer images of four colors, namely, yellow (Y), magenta (M), cyan (CN) and black (BK) are formed on the image receiving sheet to obtain full color transfer images which exactly reproduce the original.

In the present invention, it is essential that the transfer for each of the color sheets is conducted at two stages under different rotational speeds of the transfer drum 12, in which transfer is conducted under a lower speed condition at the second stage than that at the first stage. That is, it is important in the present invention to lower the transfer speed (rotational speed) in the transfer at the second stage than that in the transfer at the first stage. In the transfer at the second stage, a method of conducting transfer by one rotation of the transfer drum 12 is usually adopted. Specifically, transfer at the first stage is conducted by the first one rotation of the transfer drum 12, while the transfer at the second stage is conducted by next one rotation of the transfer drum 12.

The transfer speed (cm/min) in the transfer at the first stage is selected within a range usually from 100 to 300 (cm/min), preferably from 150 to 250 (cm/min), while the transfer speed (cm/min) in the transfer at the second stage is selected within a range usually from 10 to 150 (cm/min), preferably from 30 to 100 (cm/min). Then, the difference between the transfer speeds of both of the first stage and the second stage is preferably at least not less than 50 (cm/min), particularly preferably from 60 to 200 (cm/min). The condition for the pressing by the heat roller varies greatly depending on the layer constitution of the color proof and the ingredients constituting each of the layers, and the transfer temperature ranges usually from 25° to 140° C., preferably from 70° to 120° C., and the transfer pressure is within a range usually from 0 to 20 kg/cm$^2$, preferably from 2 to 10 kg/cm$^2$.

However, in a preferred embodiment of the present invention, the transfer pressure at the first stage is made lower than the transfer pressure at the second stage. In this case, the transfer pressure at the first stage is in a range usually from 0 to 10 kg/cm$^2$, preferably from 1 to 5 kg/cm$^2$, more preferably from 2 to 4 kg/cm$^2$. The transfer pressure at the second stage is in a range usually from 3 to 20 kg/cm$^2$, preferably from 3 to 10 kg/cm$^2$, more preferably from 4 to 10 kg/cm$^2$. The difference between the transfer pressures of both of the first stage and the second stage is usually not less than 0.5 kg/cm$^2$, preferably not less than 1 kg/cm$^2$.

In the present invention, the heat roller 42 is formed by covering the core roller 42A with the elastic member 42B. For applying pressing effectively to the color sheet 1, the thickness of the elastic member 42B is preferably in a range from 1.0 to 2.5 mm. A preferred thickness of the elastic member 42B ranges from 1.3 to 2.2 mm. If the thickness of the elastic member 42B is within the above specified range, the registration variance of the multicolor images can be prevented more preferably.

EXAMPLES

The present invention is to be explained more in details by way of preferred examples but the present invention is not restricted only to the following examples so long as it is within the scope of the invention.

Examples 1 to 6 and Comparative Examples 1 to 10

For preparing a support, an ethylene-vinyl acetate copolymer resin ("EVAFLEX P-1405" produced by Mitsui DuPont Polychemcial Co., Ltd., vinyl acetate content: 14 wt %, VICAT softening point: 68° C.) was laminated by extrusion lamination method on a biaxially stretched polyethylene terephthalate film (65 cm in width) of 75 µm in thickness to form a releasing layer having 25 µm in thickness.

Pigments shown in Table 2 were added to the photopolymerizable composition shown in Table 1 to prepare coating solutions for four color negative-type light sensitive layers and each of the coating solutions was coated by a bar coater on each of the supports and dried to prepare a light sensitive colored layer of 1.5 µm in dry thickness.

TABLE 1

| | |
|---|---|
| Vinyl acetate - vinyl versatate copolymer (80:20 wt %: average molecular weight: 50,000 in 50% methanol solution) | 12 parts by weight |
| Pentaerithritol tetraacrylate | 4.3 parts by weight |
| Michler's ketone | 0.04 parts by weight |
| Benzophenone | 0.25 parts by weight |
| p-methoxyphenol | 0.01 parts by weight |
| Methyl cellosolve | 94 parts by weight |
| Fluoro surfactant (FC-430: produced by 3M Co., Ltd.) | 0.01 parts by weight |

TABLE 2

| | |
|---|---|
| Black: Carbon black MA-100 (produced by Mitsubishi Chemical Corporation) | 1.98 parts by weight |
| Cyan: cyanine blue-4920 (produced by Dainichi Seika Co., Ltd.) | 1.10 parts by weight |
| Magenta: Seika fast carmine 1483 (produced by Dainichi Seika Co., Ltd.) | 1.36 parts by weight |
| Yellow: Seika fast yellow 2400 (produced by Dainichi Seika Co., Ltd.) | 1.36 parts by weight |

Then, an overcoat layer solution of a composition shown in Table 3 was coated to a 0.5 µm dry film thickness on a biaxially stretched polyethylene terephthalate film (65 cm in width) of 25 µm in thickness as a protection film by using a bar coater and dried. Then, the protection film and the film after coating the light sensitive layer were stacked such that the coated surfaces are opposed to each other and then pressed by a laminator.

TABLE 3

| | |
|---|---|
| Polyvinyl alcohol (GL-05, produced by Nippon Gosei Chemical Industry Co., Ltd.) | 6 parts by weight |
| Desalted water | 97 parts by weight |
| Methanol | 3 parts by weight |

For forming transfer images, a color separation screen positive film for each of the colors was stacked on the surface of the polyethylene terephthalate film as a transparent support for the negative-type colored image forming material for four colors obtained as described above, and imagewise exposure was conducted by a 4 KW metal halide lamp at a distance of 50 cm for 20 sec. Subsequently, the protection film was peeled off and developed by being dipped in a liquid developer of a composition shown in Table 4 at 30° C. for 30 sec. to form colored images for four colors. When the surface of the overcoat layer after peeling the protection film was observed, no particular abnormality was recognized.

TABLE 4

| | |
|---|---|
| Konica PS print liquid developer SDP-1 (produced by Konica Co., Ltd.) | 20 ml |
| PELLEX NBL (produced by Kao Atlas Co., Ltd.) | 50 ml |
| Water | 400 ml |

Transferred images for four colors were formed on thickly coated paper by using the four color sheets having colored images formed thereon by the device as described in Example 1 of Japanese Patent Application Laid-Open (KOKAI) No. 3-120552 (refer to FIG. 1–4). That is, the color proof was prepared by applying pressing by means of the heat roller 42 to the image receiving sheet and the color sheet having colorant images formed thereon while stacking the sheets to each other on the transfer drum 12 to transfer the colorant images to the image receiving sheet and by aplying the same treatment repeatingly for each of the color sheets. In this case, based on one color sheet, a first transfer at the first stage was conducted by first one rotation of the transfer drum 12 and a second transfer was conducted by the next one rotation of the transfer drum 12.

The thickness of the elastic member 42B on the surface of the heating roller 42 ("Silicone rubber" produced by American Roller Co., Ltd., spring hardness JIS A (JIS K6301): 70) was 3 mm.

Thus, while varying the speed at each rotation of the transfer drum 12, the transfer in each of the color sheets of four colors was conducted at two stages. As the image receiving sheet, thickly coated gloss paper ("TOKUBHISHI ART" produced by Mitsubishi Seishi Co., Ltd.), coated matte paper ("NEWAGE" produced by Kanzaki Seishi Co., Ltd.) and wood free paper ("KINBISHI" produced by Mitsubishi Seishi Co., Ltd.) were used. The transfer condition at each of the stages are shown in Table 5. The temperature of the heat roller was 80° C. throughout the stages.

TABLE 5

|  | Transfer speed (cm/min) | | Transfer pressure (kg/cm²) | |
| --- | --- | --- | --- | --- |
|  | 1st rotation | 2nd rotation | 1st rotation | 2nd rotation |
| Comp. Example 1 | 180 | — | 5 | — |
| Comp. Example 2 | 90 | — | 5 | — |
| Comp. Example 3 | 60 | — | 5 | — |
| Comp. Example 4 | 90 | — | 4 | — |
| Comp. Example 5 | 90 | — | 6 | — |
| Comp. Example 6 | 180 | 180 | 5 | 5 |
| Comp. Example 7 | 90 | 90 | 5 | 5 |
| Comp. Example 8 | 60 | 60 | 5 | 5 |
| Comp. Example 9 | 90 | 90 | 4 | 4 |
| Comp. Example 10 | 90 | 90 | 6 | 6 |
| Example 1 | 180 | 90 | 5 | 5 |
| Example 2 | 180 | 60 | 5 | 5 |
| Example 3 | 180 | 90 | 4 | 5 |
| Example 4 | 180 | 90 | 4 | 6 |
| Example 5 | 180 | 60 | 4 | 5 |
| Example 6 | 180 | 60 | 4 | 6 |

For four color images obtained in each of the image receiving sheets, a position at the greatest registration variance was selected and the distance was measured to determine an average value for five samples. Further, presence or absence of the registration variance for images in each of the image receiving sheets was evaluated by five score evaluation basis shown in following by skilled ten observers. The results are shown in Table 6.

5: Image defects due to transfer failure is not felt at all
4: Image defect portion can be found but felt scarcely
3: Image defect portion is felt are little
2: Image defect portion is felt considerably
1: Image defect portion is extremely felt.

TABLE 6

|  | Gloss art paper | | Matted coat paper | |
| --- | --- | --- | --- | --- |
|  | Registration variance (μm) | Transferability | Registration variance (μm) | Transferability |
| Comp. Example 1 | 60 | 2.8 | 68 | 2.3 |
| Comp. Example 2 | 96 | 5 | 120 | 4.4 |
| Comp. Example 3 | 160 | 5 | 220 | 5 |
| Comp. Example 4 | 48 | 3.9 | 52 | 3.2 |
| Comp. Example 5 | 120 | 5 | 140 | 5 |
| Comp. Example 6 | 60 | 3.4 | 72 | 2.7 |
| Comp. Example 7 | 104 | 5 | 128 | 5 |
| Comp. Example 8 | 184 | 5 | 232 | 5 |
| Comp. Example 9 | 52 | 4.5 | 60 | 3.5 |
| Comp. Example 10 | 132 | 5 | 148 | 5 |
| Example 1 | 64 | 5 | 76 | 5 |
| Example 2 | 68 | 5 | 80 | 5 |
| Example 3 | 48 | 5 | 52 | 5 |
| Example 4 | 52 | 5 | 56 | 5 |
| Example 5 | 48 | 5 | 56 | 5 |
| Example 6 | 56 | 5 | 60 | 5 |

|  | High quality paper | |
| --- | --- | --- |
|  | Registration variance (μm) | Transferability |
| Comp. Example 1 | 72 | 1.9 |
| Comp. Example 2 | 130 | 3.7 |
| Comp. Example 3 | 240 | 4.8 |
| Comp. Example 4 | 68 | 2.8 |
| Comp. Example 5 | 200 | 5 |
| Comp. Example 6 | 76 | 2.4 |
| Comp. Example 7 | 152 | 4.2 |
| Comp. Example 8 | 264 | 5 |
| Comp. Example 9 | 72 | 3.1 |
| Comp. Example 10 | 216 | 5 |
| Example 1 | 80 | 4.1 |
| Example 2 | 84 | 5 |
| Example 3 | 64 | 4.0 |
| Example 4 | 68 | 5 |
| Example 5 | 68 | 5 |
| Example 6 | 72 | 5 |

As apparent from the result shown in Table 6, in the methods of Comparative Examples 1 to 5 of conducting transfer in one stage, since the prevention for registration variance and the improvement for transferability conflict to each other, it is not possible to satisfy both of the prevention and the improvement. Further, in the method of Comparative Examples 6 to 10 in which transfer is conducted in two stage but the transfer time in the transfer is identical between the first stage and the second stage, only the result with no substantial difference to that in the method of Comparative Examples 1 to 5 can be obtained. On the other hand, in the method of Examples 1 to 5 according to the present invention of conducting transfer in two stages for different transfer time, both of the prevention for the registration variance and the improvement for transferability can be satisfied at the same time.

That is, in the method of Comparative Examples 1 to 5 of conducting transfer in one stage, if the transfer pressure is increased, the registration variance is worsened although transferability is improved. Further, if the transfer speed is increased, the transferability is worsened although the registration variance is improved. In summary, in one stage transfer, there is no condition capable of satisfying the prevention for the registration variance and the improvement for the transferability simultaneously is present. On the contrary, in the two stage transfer, registration variance is settled or determined by the transfer condition in the first stage, the transferability is determined by the transfer condition in the second stage, and the prevention for the registration variance and the improvement for the transferability can be satisfied at the same time by increasing the transfer speed at the first stage and lowering the transfer speed at the second stage.

In the present invention, it is desirable that the registration variance is not more than 100 μm and the transferability in case of the gloss art paper is not less than 5.

Examples 7–14

Transfer processing was conducted to prepare color proof in the same manner as in Example 1 except for changing the thickness of the elastic member 42B on the surface of the heating roller 42 to 1.8 mm or 1.5 mm and changing the transfer conditions in the first stage and the second stage as shown in Table 7 in Example 1. The result of the evaluation is shown in Table 8.

TABLE 7

| | Rosilient member thickness (mm) | Transfer speed (cm/min) | | Transfer pressure (kg/cm$^2$) | |
| --- | --- | --- | --- | --- | --- |
| | | 1st rotation | 2nd rotation | 1st rotation | 2nd rotation |
| Ex. 7 | 1.8 | 180 | 90 | 5 | 6 |
| Ex. 8 | 0.5 | 180 | 90 | 5 | 6 |
| Ex. 9 | 1.8 | 180 | 90 | 5 | 7 |
| Ex. 10 | 0.5 | 180 | 90 | 5 | 7 |
| Ex. 11 | 1.8 | 180 | 60 | 5 | 6 |
| Ex. 12 | 0.5 | 180 | 60 | 5 | 6 |
| Ex. 13 | 1.8 | 180 | 60 | 5 | 7 |
| Ex. 14 | 0.5 | 180 | 60 | 5 | 7 |

TABLE 8

| | Gloss art paper | | Matted coat paper | |
| --- | --- | --- | --- | --- |
| | Registration variance (μm) | Transferability | Registration variance (μm) | Transferability |
| Example 7 | 69 | 5 | 77 | 5 |
| Example 8 | 62 | 5 | 70 | 4.5 |
| Example 9 | 81 | 5 | 90 | 5 |
| Example 10 | 73 | 5 | 82 | 4.8 |
| Example 11 | 66 | 5 | 73 | 4.9 |
| Example 12 | 59 | 5 | 66 | 3.6 |
| Example 13 | 76 | 5 | 85 | 5 |
| Example 14 | 69 | 5 | 77 | 4.3 |

TABLE 8-continued

| | High quality paper | |
| --- | --- | --- |
| | Registration variance (μm) | Transferability |
| Example 7 | 84 | 5 |
| Example 8 | 77 | 4.1 |
| Example 9 | 98 | 5 |
| Example 10 | 89 | 4.6 |
| Example 11 | 79 | 4.3 |
| Example 12 | 72 | 2.9 |
| Example 13 | 93 | 5 |
| Example 14 | 84 | 4 |

According to the present invention described above, since both of the prevention for the registration variance and the improvement for the transferability can be satisfied simultaneously by making the transfer speed (cm/min) in the transfer at the second stage lower than that in the transfer at the first stage (by conducting transfer for each of the color sheets in two stages of different rotational speeds of the transfer drum), color proof can be transferred at high quality.

What is claimed is:

1. A method of transferring a color proof comprising stacking an image receiving sheet and a color sheet having colorant images formed on a support, applying pressing to the stacked sheets by a heating roller to transfer the colorant images to the image receiving sheet, and conducting the transfer onto the image receiving sheet repeatingly for different color sheets, the transfer for each of the color sheets being conducted at two stages with different rotational speeds of a transfer drum and the transfer being conducted at the second stage under a lower speed condition than in the first stage.

2. A method of transferring a color proof as defined in claim 1, wherein the transfer speed in the transfer at the first stage is from 100 to 300 cm/min.

3. A method of transferring a color proof as defined in claim 2, wherein the transfer speed in the transfer at the first stage is from 150 to 250 cm/min.

4. A method of transferring a color proof as defined in claim 1, wherein the transfer speed in the transfer at the second stage is from 10 to 150 cm/min.

5. A method of transferring a color proof as defined in claim 4, wherein the transfer speed in the transfer at the second stage is from 30 to 100 cm/min.

6. A method of transferring a color proof as defined in claim 1, wherein the difference between the transfer speed in the transfer at the first stage and the transfer speed in the transfer at the second stage is from 60 to 200 cm/min.

7. A method of transferring a color proof as defined in claim 1, wherein the transfer temperature is from 25° to 140° C.

8. A method of transferring a color proof as defined in claim 1, wherein the transfer pressure in the transfer at the first stage is not more than 10 kg/cm$^2$.

9. A method of transferring a color proof as defined in claim 8, wherein the transfer pressure in the transfer at the first stage is from 1 to 5 kg/cm$^2$.

10. A method of transferring a color proof as defined in claim 9, wherein the transfer pressure in the transfer at the first stage is from 2 to 4 kg/cm$^2$.

11. A method of transferring a color proof as defined in claim 1, wherein the transfer pressure in the transfer at the second stage is from 3 to 20 kg/cm$^2$.

12. A method of transferring a color proof as defined in claim 11, wherein the transfer pressure in the transfer at the second stage is from 4 to 10 kg/cm².

13. A method of transferring a color proof as defined in claim 1, wherein the difference between the transfer pressure in the transfer at the first stage and the transfer pressure in the transfer at the second stage is not less than 1 kg/cm².

14. A method of transferring a color proof as defined in claim 1, wherein the surface of the heating roller comprises an elastic member of 1 to 2.5 mm in thickness.

15. A method of transferring a color proof as defined in claim 14, wherein the surface of the heating roller comprises an elastic member of 1.3 to 2.2 mm in thickness.

16. A method of transferring a color proof as defined in claim 1, wherein the surface of the heating roller comprises an elastic member having a spring hardness JIS A (JIS K6301) in range from 10 to 100.

17. A method of transferring a color proof as defined in claim 1, wherein the support of the color sheet comprises a film having a maximum heat expansion coefficient ($\alpha$tmax) of not more than $2.5 \times 10^{-5}$/°C.

18. A method of transferring a color proof as defined in claim 1, wherein the support of the color sheet comprises a film having an angle of orientation from $-20°$ to $+20°$.

19. A method of transferring a color proof as defined in claim 1, wherein the support of the color sheet has a thickness of from 10 to 300 μm.

20. A method of transferring a color proof as defined in claim 1, wherein the color sheet has a releasing layer formed with an ethylene-vinyl acetate copolymer having softening point from 50° to 120° C. disposed between the support and a colorant layer.

* * * * *